(12) United States Patent
Adams et al.

(10) Patent No.: US 8,279,687 B2
(45) Date of Patent: Oct. 2, 2012

(54) SINGLE SUPPLY SUB VDD BIT-LINE PRECHARGE SRAM AND METHOD FOR LEVEL SHIFTING

(75) Inventors: Chad A. Adams, Byron, MN (US); George M. Braceras, Essex Junction, VT (US); Daniel M Nelson, Rochester, MN (US); Harold Pilo, Underhill, VT (US); Vinod Ramadurai, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 12/779,608

(22) Filed: May 13, 2010

(65) Prior Publication Data

US 2011/0280088 A1 Nov. 17, 2011

(51) Int. Cl.
*G11C 7/00* (2006.01)
(52) U.S. Cl. ............. 365/189.11; 365/203; 365/226
(58) Field of Classification Search ........... 365/189.11, 365/189.09, 203, 226, 227, 230.06, 189.07, 365/154, 156
See application file for complete search history.

(56) References Cited

U.S. PATENT DOCUMENTS

| | | | |
|---|---|---|---|
| 4,984,204 A * | 1/1991 | Sato et al. | 365/189.11 |
| 5,053,652 A * | 10/1991 | Sato et al. | 327/53 |
| 6,108,256 A | 8/2000 | Schneider | |
| 6,373,753 B1 * | 4/2002 | Proebsting | 365/189.09 |
| 6,657,886 B1 | 12/2003 | Adams et al. | |
| 6,741,517 B1 | 5/2004 | Fisher et al. | |
| 6,798,688 B2 | 9/2004 | Joshi | |
| 6,901,003 B2 | 5/2005 | Adams et al. | |
| 7,016,251 B2 | 3/2006 | Gabric et al. | |
| 7,061,793 B2 | 6/2006 | Barth, Jr. et al. | |
| 2006/0274587 A1 | 12/2006 | Houston | |
| 2007/0109886 A1 | 5/2007 | Terzioglu et al. | |
| 2007/0236256 A1 | 10/2007 | Cherukari et al. | |
| 2007/0291561 A1 | 12/2007 | Braceras et al. | |
| 2008/0031063 A1 | 2/2008 | Braceras et al. | |
| 2008/0140925 A1 | 6/2008 | Lee et al. | |

OTHER PUBLICATIONS

M. Khellah et al "Wordline & Bitline Pulsing Schemes for Improving SRAM Cell Stability in Low-Vcc 65nm CMOS Designs" IEEE 2006 Symposium on VLSI Circuits Digest of Technical Papers pp. 12-13.
Bhavnagarwala et al "A Sub-600mV, Fluctuation tolerant 65nm CMOS SRAM Array with Dynamic Cell Biasing" 2007 Symposium on V/LSI Circuits Digest of Technical Papers pp. 78-79.

* cited by examiner

*Primary Examiner* — Gene Auduong
(74) *Attorney, Agent, or Firm* — Robert Walsh; David Cain

(57) ABSTRACT

A reduced bitline precharge level has been found to increase the SRAM Beta ratio, thus improving the stability margin. The precharge level is also supplied to Sense amplifier, write driver, and source voltages for control signals. In the sense amplifier, the lower precharge voltage compensates for performance loss in the bit-cell by operating global data-line drivers with increased overdrive. In the write driver, the reduced voltage improves the Bitline discharge rate, improves the efficiency of the negative boost write assist, and decreases the reliability exposure of transistors in the write path from negative boost circuit.

20 Claims, 4 Drawing Sheets

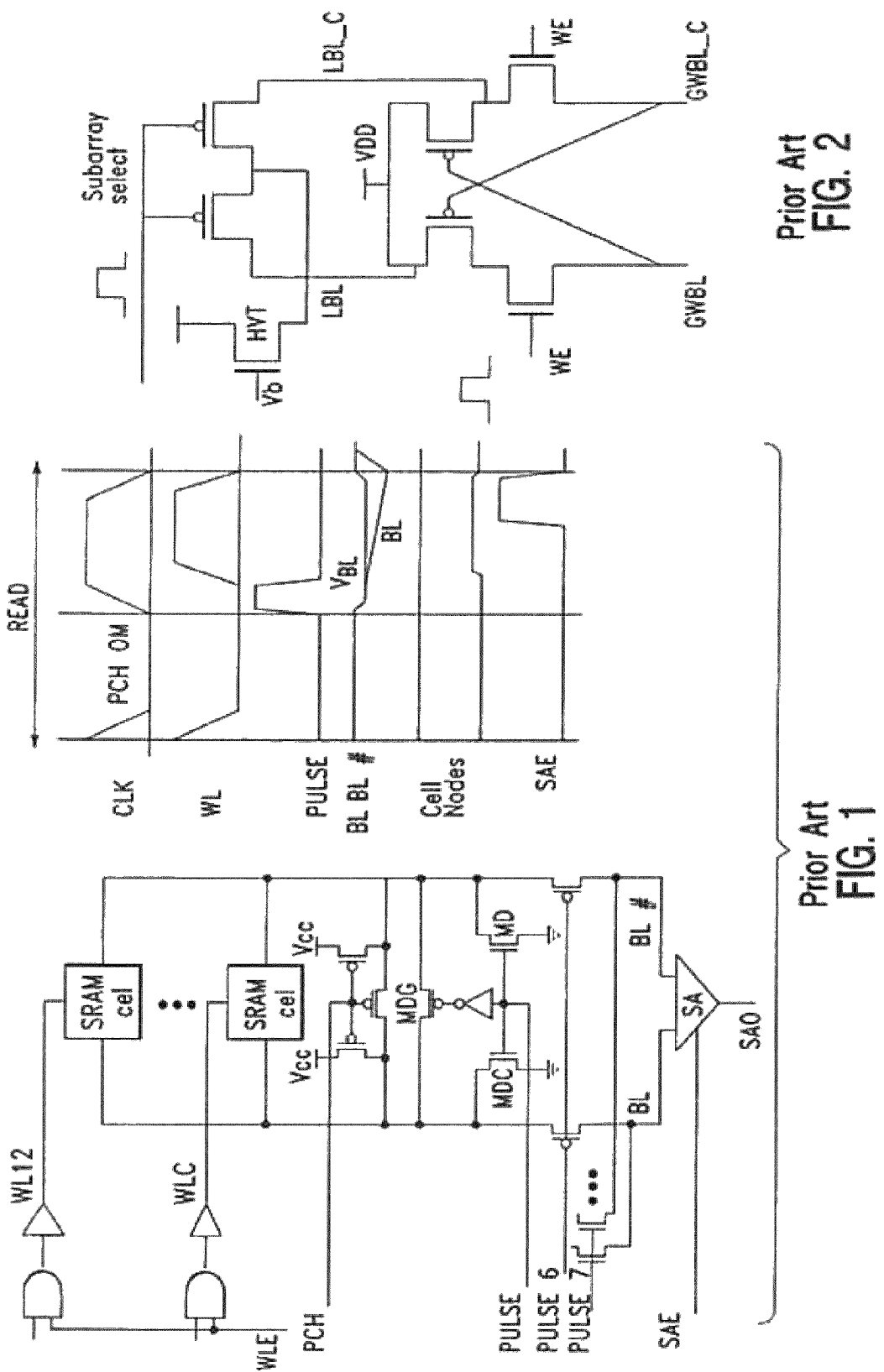

SINGLE SUPPLY SUB VDD BIT-LINE PRECHARGE SRAM AND METHOD FOR LEVEL SHIFTING

BACKGROUND OF THE INVENTION

1. Field of the Invention

This invention is related to storage arrays, essentially static random access memories (SRAMs) and more particularly to precharging bitlines (BL) to sub-VDD levels.

2. Description of Background

High performance low power SRAM design including multiple local cell groups are well known in the prior art including for example U.S. Pat. Nos. 5,668,761 and 6,657,886. Each cell group includes multiple local cell and local true and complements bitlines. Each SRAM cell includes a pair of inverters that operate together in a loop to store true and complement data. However, competing requirements of Read and Write margin improvements on the SRAM cell design limit the scalability of cell transistor dimensions and operating voltages in a conventional cell and static power supplies. These patents did not employ pre-charging bitlines to sub-VDD levels. During a read operation, SRAM Bitlines are typically precharged to a full VDD level. Charge injection from the VDD-precharged Bitlines into the cell node with the "0" level stored in the cell, causes the cell node to rise above the GND level. If the rise of the "0" level on the Low-side of the cell reaches the trip-point of the feedback inverter of the cell (driving the "1" side of the cell), the data in the cell can be flipped, and therefore, corrupted. Therefore, precharging bitlines to a sub-VDD level will decrease the charge injection into the cell and improve the stability margin of the cell.

Precharging Bitlines to sub-VDD level has been done by M. Khellah, et. al. in VLSI 2006 (pg. 12-13) which is hereby included in its entirety herein. It describes a method for briefly pulsing Bitlines towards GND before Wordline activation which is shown in FIG. 1. This solution provides a stability benefit at a cost of cycle time. This is because the precharge pulse has to occur before Wordline activation, which directly impacts access time and cycle time. Furthermore, the discharge level of the Bitline is poorly controlled. The pulse width of the device controlling the GND-connected devices (MD/MDC) has to be precisely timed. Any variations of this pulse width have to be calibrated with the variations of the GND-connected devices. For example, if the pulse width is too wide, then the bitlines are precharged to a level which is too low to provide the stability margin. Precharging below the optimum level will cause further degrade in the stability margins.

Bhavnagarwala, et. al. in 2007 Symposium on VLSI Digest of Technical Papers (pg. 78-79) which is hereby included in its entirety herein describes and shows an NFET source follower that is used to precharge Bitlines to sub-VDD level. As illustrated in FIG. 2 the gate of the NFET precharge device is externally controlled at Vb to allow the user to change the level of Bitline precharge voltage. It has been known for large signal sensing schemes that a lower BL precharge voltage directly translates into larger stability margin. For such a design the Vb is driven from the pad having a DC signal, The DC signal is controlled external to the memory to allow the user to change the level of the precharge voltage. This design is simple and it provides a low risk addition to POR circuitry. There are two drawbacks to this design. One drawback is that the source follower NFET design has a very limited conduction range. When precharge occurs, the source follower NFET can quickly precharge bitlines to about VDD/2. From VDD/2 to the final precharge level (approximately VDD-Vtn), the overdrive of the NFET quickly decreases as its SOURCE is raised towards VDD-Vtn, which weakens the device, increases the slew rate of the bitline precharge, and degrades the cycle time. Another drawback of this design is that the precharge level can have large variations based on the Process, Voltage, and Temperature (PVT) of operation. This PVT variation will result in large variations of the Vt of the device and therefore, precharge levels on the bitline.

SUMMARY OF THE INVENTION

It is a purpose of the invention to improve SRAM stability margin by decreasing the cell failure rate at any given voltage.

It is another purpose of the invention to reduce reliability exposure from negative-boosted write assist by reducing the supply level on transistor gates in the write path.

It is yet another purpose of the invention to improve efficiency of negative-boosted write assist by decreasing leakage from unselected column circuitry.

It is yet another purpose of the invention to improve AC and DC power consumption in sense-amp/write circuits.

An embodiment of the present invention provides a Bitline precharge design with no cycle time pushouts associated with creating a sub-VDD precharge level. The embodiment also provides a self-compensating body-connected bias technique by adjusting the body-contacted bitline precharge device to reduce PVT variations on the precharge level. In addition the embodiment also provides a method for level-shifting the sub-VDD sense-amp level to a full VDD global data line.

A basic concept of an embodiment of the present invention uses a diode-connected PFET device to provide the sub-VDD Bitline precharge level. The PFET device is configured as a body-contacted device with the body connected to a circuit that compensates the precharge level, and decreases the magnitude of the low-level of the "0" side of the cell, thus improving the stability margin. The reduced precharge level is also supplied to a sense-amplifier, write-driver and source voltages for control signals of the above-mentioned. In the sense-amp, the lower precharge voltage compensates for performance loss in the bit-cell by operating global data-line drivers with increased overdrive. In the write driver, the reduced voltage improves the Bitline discharge rate, improves the efficiency of the negative boost write assist, and decreases the reliability exposure of transistors in the write path from the negative boost circuit.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a prior art SRAM circuit design;

FIG. 2 illustrates another prior art SRAM circuit design:

The detailed description explains the preferred embodiments of the invention, together with advantages and features, by way of example with reference to the drawings.

DETAILED DESCRIPTION OF THE INVENTION

Figure 3:
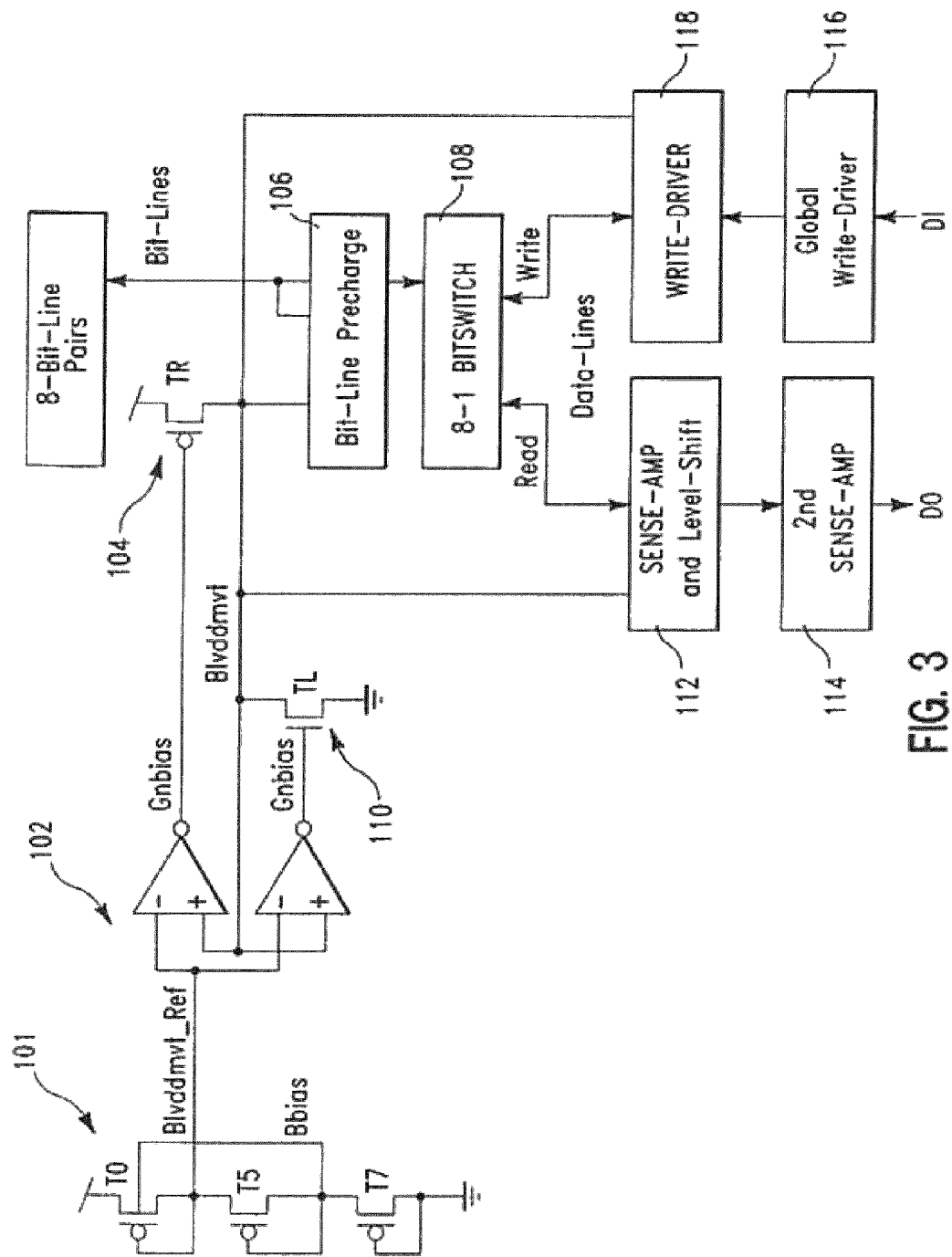
FIG. 3 illustrates a block diagram of an embodiment in accordance with the present invention SRAM circuit design.

Turning now to the drawings in greater detail, it will be seen that in FIG. 3 illustrates a block diagram of a preferred embodiment of the present invention that improves SRAM stability. This circuit design provides a bitline precharge with no cycle time pushouts associated with creating a sub-VDD precharge level as well as a self-compensating body-connected bias technique by adjusting the body-contacted bitline precharge device to reduce PVT variations on the pre-charge level. The circuit includes a method for level shifting the sub-VDD sense-amplifier level to a full global data line to the read bit-switch, BL restore, SA restore and write-driver restore which are supplied from Blvddmvt bias power supply (approx. VDD-Vt) to save power and alleviate reliability exposure from the write assist. As shown in FIG. 3 Blvddmvt is generated by a reference source 101 that is connected to a Push-Pull Regulator 102 that is biased with a single, small leakage compensation device 110 and a distributed regulator device 104 that is connected to a bitline precharge 106 that is connected to a bit switch 108 (8-1 BITSWITCH). The regulator drives a single, leakage compensation device 110 (TL). This device prevents the Blvddmvt level from rising above the input reference (Blvddmvt_Ref) should the cell leakage be strong enough to drive the bitline level towards VDD. The Blvddmvt is passed through the write data-lines to a sense amplifier and level shifter 112 (SENSE-AMP & Level-Shift) on to a $2^{nd}$ sense amplifier driver 114 ($2^{nd}$ Sense-Amp) and to the output (D0). The input (D1) is connected to the global write drivers 116 (Global Write-Driver) then to the local write drivers 118 (Write-Driver) through the write data-lines. As can now be realized the design provides a method for level shifting the sub-VDD sense-amp level to a full global read data line and then to the $2^{nd}$ sense amplifier. The read bit-switch, BL restore, SA restore and write-driver restore are supplied from Blvddmvt bias supply (approx. VDD-Vt) to save power and alleviate reliability exposure from the negatively-boosted bitlines generated by the local write driver.

Figure 4:
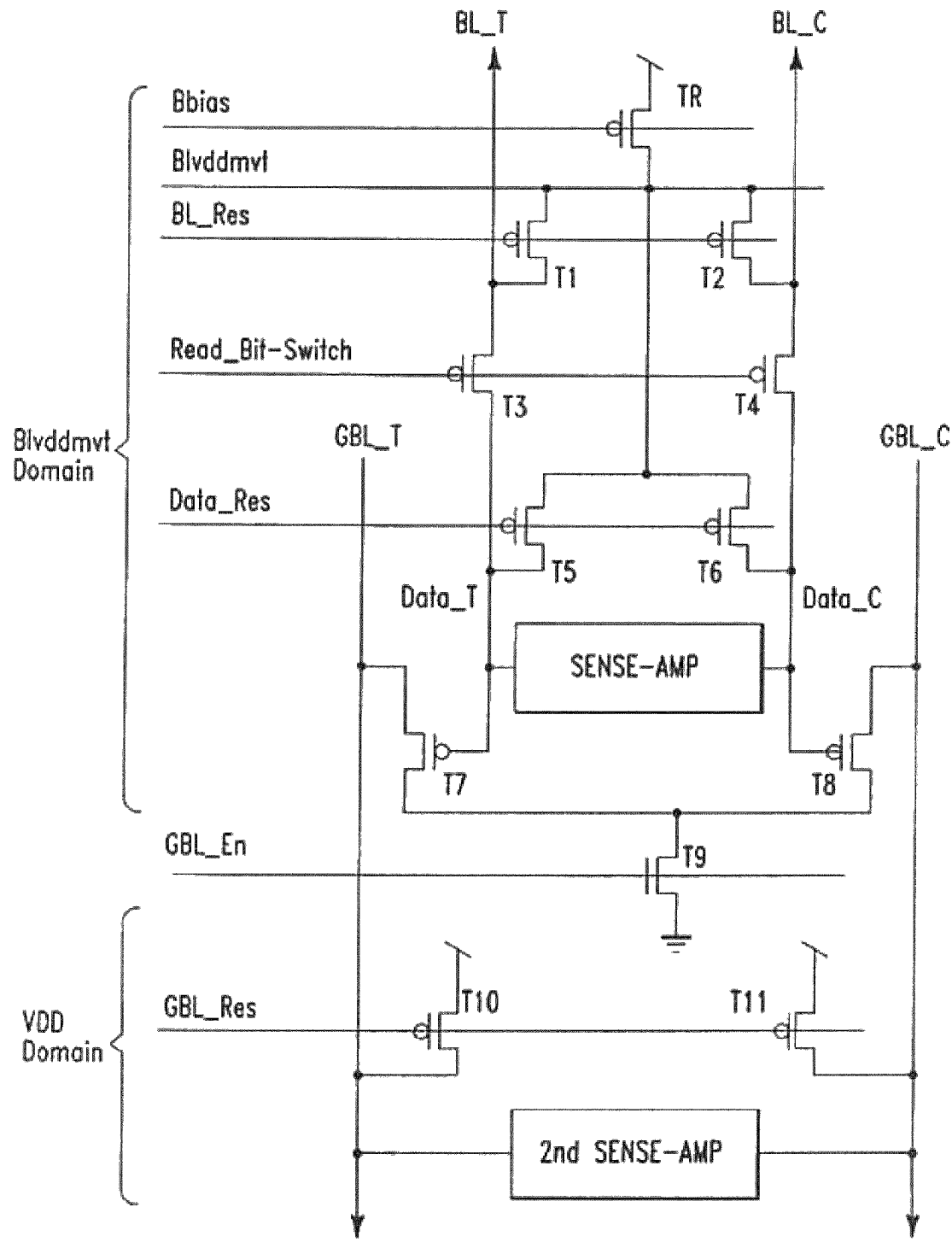
FIG. 4 illustrates a schematic of an embodiment in accordance with the present invention of an SRAM design.

Attention is now directed to FIG. 4 which illustrates a schematic version of the highly stable SRAM control circuitry discussed above which improves the efficiency and AC and DC power consumption in sense-amplifier and/write circuits. Distributed regulator device TR provides a robust precharge level (Blvddmvt) to the Bitlines (BL_T, BL_C) and Sense-Amp data lines (Data_T, Data_C). This device (TR) is locally regulated by global regulator control signal, Gbias generated from the global push-pull regulator. The voltage of Blvddmvt is approximately 0.7×VDD. This lower level is converted to the full VDD level at the global bitline data bus (GBL_T and GBL_C). PFET global bitline driver devices (T7 and T8) discharge one of the global bitlines upon activation. The voltage swing on the gates of T7/T8 transition from Blvddmvt during the precharge phase to VSS during the active phase. During the precharge phase, inadvertent turn-on of the global bitline drivers must be prevented. Thus, a global bitline enable signal, GBL_En connects to the global bitline enable device to control the activation of the global bitlines. During precharge, T9 is turned off (GBL_En=0) in order to prevent T7/T8 from turning on as their gates are connected to the lower Blvddmvt voltage. During activation, either Data_T or Data_C will transition from Blvddmvt to VSS in order to turn-on T7 or T8 to discharge the global bitline bus towards VSS. During this activation phase, T9 is turned on temporarily to activate GBLs. Devices T10 and T11 are the VDD-precharge devices which return GBL_C and GBL_T signals to VDD after the activation phase is complete. Thus, the level shifting between the Blvddmvt domain and the VDD domain is enabled by devices T7/T8 and global bitline enable device T9.

In the write drive, Blvddmvt is also used as the precharge level for write data-lines. This provides four advantages: 1) improves the reliability exposure of the negatively boosted write path by relaxing the gate to source/drain potential across devices in the write path. All PFET devices are also driven to the Blvddmvt potential during their off state to relax this potential. 2) Improves BL discharge rate by starting BL discharge during write from the lower Blvddmvt potential; 3) improves power by decreasing the level to precharge to, and 4) improves boost efficiency by decreasing the leakage contribution from the unselected bit lines to the selected bit line for writing.

Figure 5A:
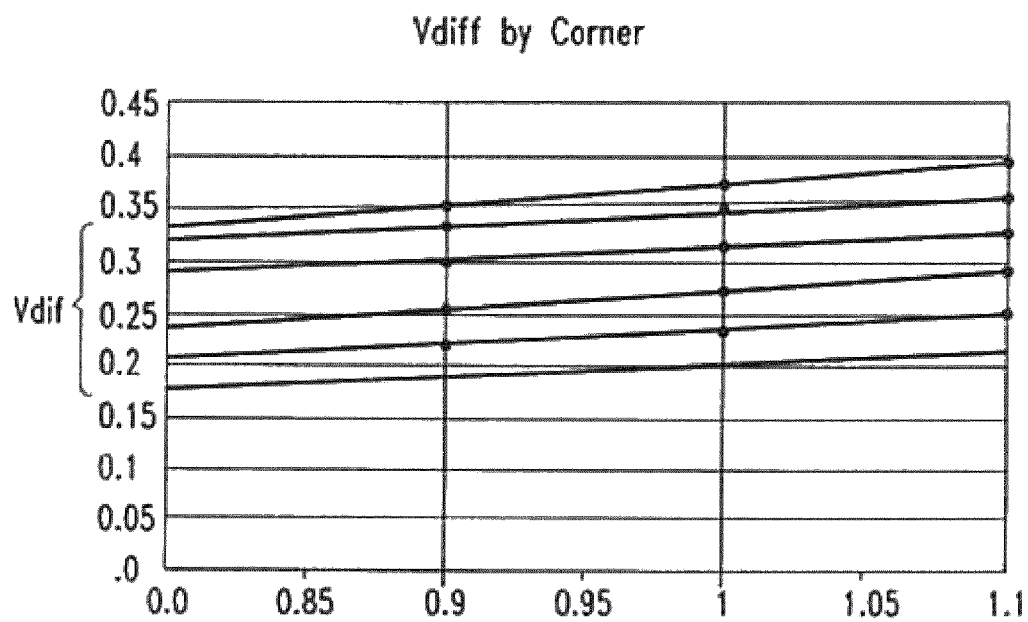
FIGS. 5A and 5B are graphs that compare VDD-Vt tracking of prior art designs and the present invention.
Figure 5B:
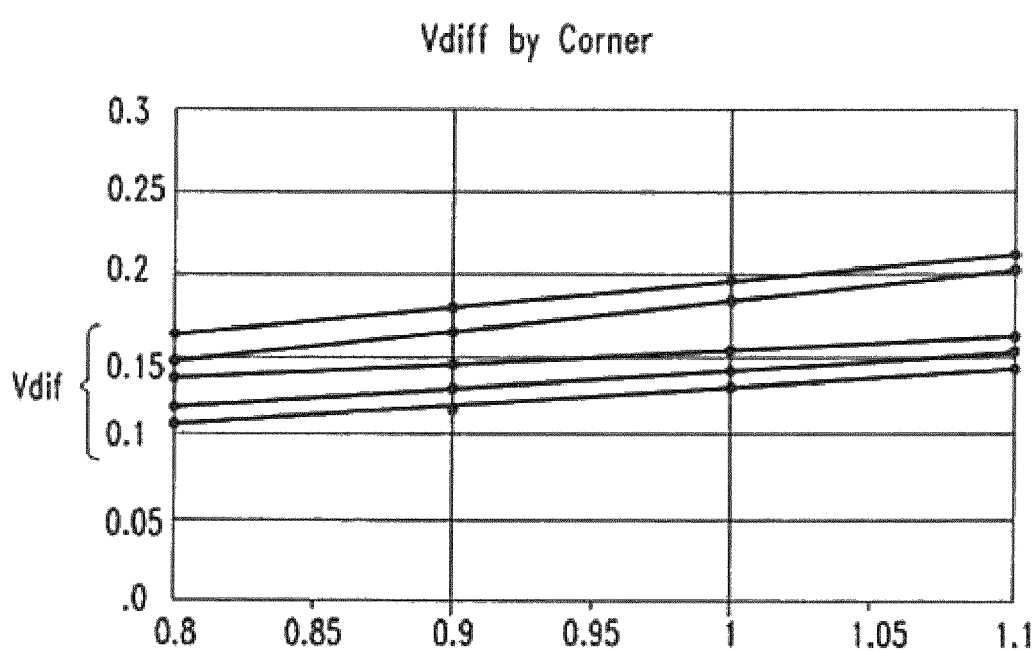

To improve the PVT variations associated with regulation of the Blvddmvt network, the input reference to the regulator TR shown in FIG. 3 and FIG. 4 is designed to compensate for the variations as shown in FIG. 5B. This circuit reduces the BL precharge level variations from about 180 mV to 70 mV as shown in the graph FIG. 5B of the reference level of Blvddmvt. The signal BBIAS connects to an N-body of the diode-connected PFET in FIG. 3. It has been demonstrated that at low-temperature and worst-case process conditions, when VTs are the highest, that the BBIAS transitions closer to VSS to reduce the body-effect on the diode-connected PFET and thus compensate for higher Vts. Conversely, at high-temperature and best-case process, BBIAS transitions closer to VDD to increase the Vt of the diode-connected PFET. The advantage of this reference scheme is a 2.5X reduction of the variation of the regulated bitline voltage. A comparison is illustrated by the graphs of a prior art circuit in the upper FIG. 5A and the lower graph 5B that illustrates the results of a circuit in accordance with the present invention.

Logic circuits used to apply source voltages of the control signals to the Sense-Amp circuitry shown in FIG. 4 are supplied from VDD. Whereas the read bit-switch (T3/T4), BL restore (T1/T2), SA restore (T5/T6) are supplied from Blvddmvt supply (approx. VDD-Vt) to save power and alleviate reliability exposure from the write assist.

While the preferred embodiment to the invention has been described, it will be understood that those skilled in the art, both now and in the future, may make various improvements and enhancements which fall within the scope of the claims which follow.

What is claimed is:

1. A pre-charge bit-line circuit for a static random access memory (SRAM) having a plurality of read/write sense amplifiers, and drivers comprising:
   a regulated power supply source providing a reference voltage less than Vdd;
   a bias circuit having a regulator circuit connected to the power supply and a distributed regulator that is connected to the bit-lines; and
   a level shifting circuit providing a bit-line control signal to activate the bit-line to a full Vdd voltage and return the bit-lines to the reference voltage level.

2. The pre-charge circuit of claim 1 wherein the regulator circuit includes a leakage compensation circuit that prevents the distributed regulator from rising above the reference voltage.

3. The pre-charge circuit of claim 2 wherein the regulator circuit is a push-pull device.

4. The pre-charge circuit of claim 3 wherein the distributed regulator further is a self-compensating body connected device.

5. The pre-charge circuit of claim 4 wherein the self-compensating body connected device is a diode-connected PFET to compensate the reference level to the bit-lines.

6. The pre-charge circuit of claim 1 wherein level shifting includes a first sense amplifier and write drivers for level shifting the sense amplifiers from the reference level to full Vdd voltage.

7. The pre-charge circuit of claim 6 include a second sense amplifier returning the bit-lines to the reference voltage.

8. A pre-charge bit-line circuit for a static random access memory (SRAM) having a plurality of read/write sense amplifiers, and drivers comprising:
 a regulated power supply source providing a reference voltage less than Vdd;
 a bias circuit having a regulator circuit connected to the power supply and a self-compensating body connected device is connected to the bit-lines;
 a level shifting circuit having a first sense amplifier and write drivers for level shifting the sense amplifiers from the reference level to full Vdd and a second sense amplifier returning the bit-lines to the reference voltage.

9. The pre-charge circuit of claim 8 wherein the self-compensating body connected device is a diode-connected PFET to compensate the reference level to the bit-lines.

10. The pre-charge circuit of claim 9 wherein the regulator circuit is a push-pull device.

11. The pre-charge circuit of claim 10 wherein the regulator circuit includes a leakage compensation circuit that prevents the distributed regulator from rising above the reference voltage.

12. The pre-charge circuit of claim 11 includes logic circuits to apply Vdd voltages to sense amplifier circuits.

13. The pre-charge circuit of claim 12 includes logic circuits to apply reference voltage to bit-lines restore and sense amplifier restore.

14. A method for pre-charging a bit-line circuit in a static random access memory (SRAM) having a plurality of read/write sense amplifiers, and drivers comprising the steps of;
 providing a reference voltage source less than Vdd;
 regulating the reference voltage source;
 biasing the reference voltage source;
 compensating the reference voltage supplied to the bit-lines;
 generating a first control signal for level shifting and activating a bit-line to a full Vdd voltage; and
 later generating a second control signal to return the bit-line to the reference voltage.

15. The method for pre-charging a bit-line circuit of claim 14 including a step of adjusting the reference voltage for leakage.

16. The method for pre-charging a bit-line circuit of claim 15 wherein the step of adjusting the reference voltage for leakage prevents the reference voltage to the bit-lines from rising above the reference voltage.

17. The method for pre-charging a bit-line circuit of claim 16 using a push-pull system for level shifting.

18. The method for pre-charging a bit-line circuit of claim 17 connecting the reference to body of a PFET diode for self-compensating the reference voltage.

19. The method for pre-charging a bit-line circuit of claim 18 wherein the step of generating a first control signal for level shifting includes a sense amplifier and a write driver.

20. The pre-charge circuit of claim 19 wherein the step of generating a second control signal level shifting includes a first sense amplifier and write driver.

* * * * *